US008216384B2

(12) United States Patent
Kumar et al.

(10) Patent No.: US 8,216,384 B2
(45) Date of Patent: Jul. 10, 2012

(54) COMBINATORIAL APPROACH TO THE DEVELOPMENT OF CLEANING FORMULATIONS FOR WET REMOVAL OF HIGH DOSE IMPLANT PHOTORESIST

(75) Inventors: Nitin Kumar, Fremont, CA (US); Guizhen Zhang, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 144 days.

(21) Appl. No.: 12/614,310

(22) Filed: Nov. 6, 2009

(65) Prior Publication Data

US 2010/0175715 A1  Jul. 15, 2010

Related U.S. Application Data

(60) Provisional application No. 61/112,557, filed on Jan. 15, 2009.

(51) Int. Cl.
*C23G 1/02* (2006.01)

(52) U.S. Cl. ......... 134/3; 134/1; 134/2; 134/26; 134/28; 134/30; 134/34; 134/35; 134/36; 134/41; 134/42; 134/902; 216/49; 216/83; 216/84; 438/5; 438/7; 438/14; 438/725; 438/745; 438/746; 510/175

(58) Field of Classification Search .............. 216/49, 216/83, 84; 438/5, 7, 14, 725, 745, 746; 510/175; 134/1, 2, 3, 26, 28, 30, 34, 35, 134/36, 41, 42, 902
See application file for complete search history.

(56) References Cited

U.S. PATENT DOCUMENTS

| | | | | |
|---|---|---|---|---|
| 3,944,421 | A * | 3/1976 | Lewis et al. | 430/299 |
| 4,180,422 | A * | 12/1979 | Rosvold | 438/478 |
| 4,718,974 | A * | 1/1988 | Minaee | 438/708 |
| 2007/0089761 | A1* | 4/2007 | Banerjee et al. | 134/34 |
| 2007/0161248 | A1* | 7/2007 | Christenson et al. | 438/689 |
| 2007/0227556 | A1* | 10/2007 | Bergman | 134/3 |
| 2009/0281016 | A1* | 11/2009 | Cooper et al. | 510/176 |
| 2010/0304313 | A1* | 12/2010 | Zhang et al. | 430/432 |

* cited by examiner

*Primary Examiner* — Bibi Carrillo

(57) ABSTRACT

Embodiments of the current invention describe a cleaning solution for the removal of high dose implanted photoresist, along with methods of applying the cleaning solution to remove the high dose implanted photoresist and combinatorially developing the cleaning solution.

9 Claims, 5 Drawing Sheets

US 8,216,384 B2

COMBINATORIAL APPROACH TO THE DEVELOPMENT OF CLEANING FORMULATIONS FOR WET REMOVAL OF HIGH DOSE IMPLANT PHOTORESIST

FIELD OF THE INVENTION

The present invention relates generally to semiconductor processing. More specifically, a cleaning solution for the removal of high dose implanted photoresist is described, along with methods of applying the cleaning solution and combinatorially developing the cleaning solution.

BACKGROUND OF THE INVENTION

During the fabrication of transistors, resistors, diodes, and other microelectronic devices, a common practice is the implantation of a dopant into a substrate. In a transistor, the implant is directed to a portion of an active area between isolation regions. The dopant is typically B, P, or As ions that are implanted at high energy of up to 150 keV to form features such as lightly doped source/drain (S/D) regions or more heavily doped S/D regions in the substrate. Other parts of a device including a gate electrode and sidewall spacers adjacent to the gate may also be doped by an ion implant process.

The ion implant is performed through a mask that is usually a photoresist layer which is patterned to selectively expose regions of the substrate that are to be doped. The photoresist must be thick enough to prevent ions from reaching protected substrate regions. Unfortunately, the mask is not inert toward the high energy ions. As a result, the top portion of the photoresist layer is transformed into a hard carbonized crust that is difficult to remove. A plasma etch can strip the crust but often attacks the substrate or other portions of a device to cause a loss in performance.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Embodiments of the current invention describe cleaning solutions and methods to remove high dose implanted photoresist from semiconductor substrates, including but not limited to silicon (amorphous and polysilicon), silicon nitride, and silicon dioxide. The processes described herein provide a low temperature (below 100° C.) "wet" solution to removal of high dose implanted photoresist, also known as high dose implant strip (HDIS.) An all wet solution is of particular value to high k metal gate applications. The cleaning solutions may be solvent based or acid based. Optimization of these types of cleaning solutions for the removal of high dose implanted photoresist was performed using high throughput combinatorial methodologies to identify cleaning solution chemistries that are compatible with typical substrate materials and that can be used at lower temperatures (less than 100° C.).

Figure 1:
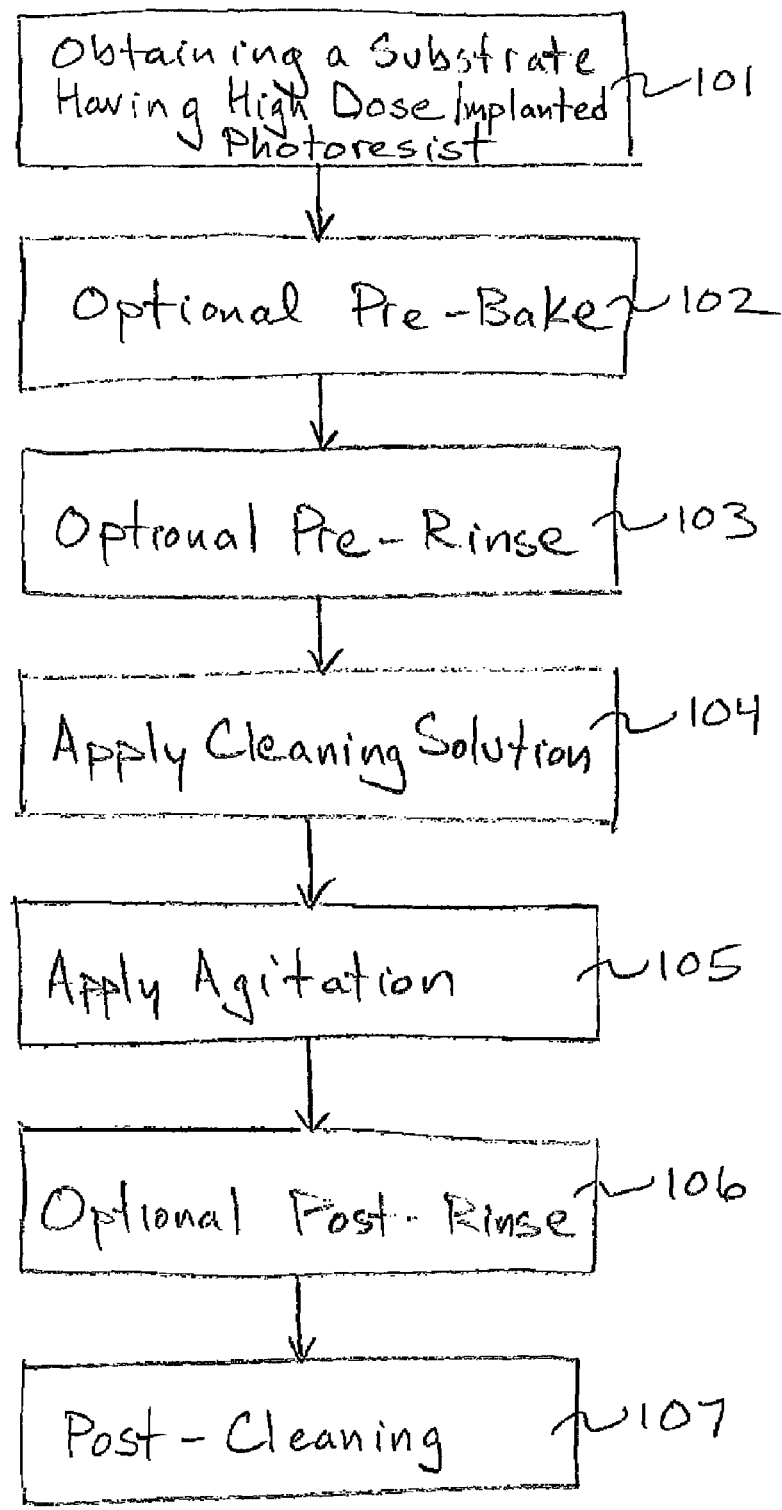
FIG. 1 is a flowchart describing a cleaning process for a high dose implanted photoresist from a substrate according to various embodiments.
Figure 2:
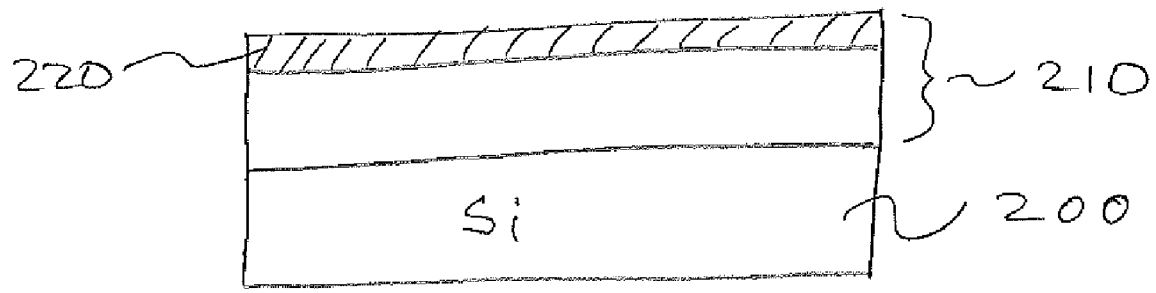
FIG. 2 illustrates a substrate having a layer of high dose implanted photoresist, according to an embodiment.

At block 101 of the flowchart in FIG. 1, a substrate 200 having a photoresist that has served as a mask during a high dose implant is obtained to be cleaned. After a high dose implant the photoresist material 210 will include a hard crust 220 of carbonized material on its surface, as illustrated in FIG. 2. The substrate 200 has a layer of photoresist material 210 having a hard crust 220. The photoresist material 210 will also include the implanted ions, typically arsenic (As) or boron (B). The dose of implanted ions may be approximately $1$-$5 \times 10^{15}$ atoms/cm$^2$ implanted at an energy of between 1 KeV-5 KeV or $1$-$5 \times 10^{14}$ atoms/cm$^2$ implanted at an energy of between 1 KeV-5 KeV. The substrate 200 may be a silicon substrate that may have surfaces formed of silicon dioxide, silicon nitride, amorphous silicon, or polysilicon. The challenge is to optimize the cleaning solution to remove the hard crust 220 and the remaining photoresist material 210 without etching more than 1 angstrom of the substrate 200 during each cleaning step, particularly when cleaning a substrate 200 processed in the 45 nm or 32 nm node. There may typically be many cleaning steps.

At block 102, an optional pre-baking of the substrate may be performed. The pre-bake may be done at a temperature in the range of 100° C. and 200° C. For higher dose implanted photoresists the pre-bake may be done at temperatures below 150° C. The temperature may be determined by the temperature below which the hard crust 220 on the photoresist material 210 will not "pop" or crack and thus outgas and contaminate the substrate 200. In one particular embodiment the pre-bake may be at 190° C. for approximately 20 minutes. The pre-bake may be performed to enhance the removal of the photoresist material 210.

At block 103, the substrate 200 may optionally be pre-rinsed with a solvent rinse. Alternatively, the pre-rinse may be performed with deionized water at room temperature or at a temperature above room temperature. In one embodiment the temperature of a deionized water pre-rinse may be approximately 100° C.

At block 104 of FIG. 1, the photoresist material 210 and the hard crust 220 are removed by applying a cleaning solution. The cleaning solution is formulated to remove both the hard crust 220 of the photoresist material 210 as well as the layer of photoresist under the crust. In an embodiment, the cleaning solution is applied in a single application for less than 30 minutes and in some instances less than 10 minutes to remove the photoresist material 210 in an all-wet chemistry process. In another embodiment, the cleaning solution may be at a temperature of less than 100° C.

The cleaning solution may be a strong acid based oxidizing system designed to attack the photoresist material 210 by oxidation. The strong acid based cleaning solution may be a mixture of a strong acid, such as $H_2SO_4$, HF, perchloric acid, or a periodic acid, and at least one strong oxidizer, such as $H_2O_2$ or $HNO_3$. In one embodiment the cleaning solution may be formed of a mixture of $H_2O_2$, $H_2SO_4$, and $HNO_3$ where the ratio of $H_2O_2$ to $H_2SO_4$ is approximately 0.01-0.02 to 1, and the ratio of $HNO_3$ to $H_2SO_4$ may be approximately 0.1-0.2 to 1. In one particular embodiment, the acid based cleaning solution may be applied to the substrate 200 for a time in the approximate range of 5 minutes to 30 minutes while shaking the substrate 200 to agitate the cleaning solution and the photoresist material 210 to improve removal of the photoresist material 210. Additionally, the acid based cleaning solution may be heated within a range of 70° C. and 100° C. to apply a heated cleaning solution to the substrate and the substrate may also be heated to be within this temperature range. The removal of the photoresist material 210 can be accelerated by increasing the temperature of the cleaning solution.

Alternatively, the cleaning solution may be a solvent based solution formulated to dissolve the photoresist. The solvent based cleaning solution may be a combination of an organic solvent, a fluoride ion donor, an acid, and an oxidizing agent. Additional components of the solvent based cleaning solution may include an oxidizing agent, a passivating agent for the substrate, and a surfactant. In an embodiment, the organic solvent may be dimethyl sulfoxide (DMSO), sulfolane, isopropanol, 1-methyl-2-pyrrolidone (NMP), propylene carbonate ($PCO_3$). The fluoride ion donor may be any compound that will provide fluoride ions in solution such as $NH_4F$. The organic acid may be citric acid, $NH_4OH$, or HCl and may be added to improve the removal of the photoresist material 210.

In one embodiment, the solvent based cleaning solution may be formed of a mixture of the two solvents DMSO (0%-100% by volume of the solution) and NMP (0%-100% by volume of the solution). In a particular embodiment, the cleaning solution may be formed of 95%-100% (by volume) of NMP where the embodiments of less than 100% NMP may include water, TMAH and hexadecane. In another particular embodiment, the cleaning solution may be formed of DMSO in the approximate range of 90-100% by volume where the embodiments of less than 100% DMSO include water, TMAH, and hexadecane. This cleaning solution was applied to the substrate 200 at a temperature in the approximate range of 80° C. and 85° C. for a time of approximately 30 minutes while shaking the substrate to create agitation of the cleaning solution and photoresist material 210.

In an embodiment, a surface modifier may be added to the cleaning solution as a passivating agent for the substrate 200. In particular, silane-based materials, such as organosilanes, can be the surface modifier in embodiments of the invention. In some embodiments, the surface modifier may be formed of an amphiphilic compound such as a polyvinyl alcohol (PVA), a PVA copolymer, an amphiphilic macromolecule, a modified starch compound, a protein compound, a diblock copolymer, a triblock copolymer, or a dendrimer. The PVA polymers may include: co-ethylene, co-cation, co-siloxane, co-anion (88% hydrolyzed), and co-anion (80% hydrolyzed). As utilized herein, amphiphilic is a term describing a chemical compound possessing both hydrophilic and hydrophobic properties. The amphiphilic surface modifiers can also be tailored to have certain chemical properties and size for different applications. In one particular embodiment, the surface modifier is the organosilane chloromethyl trimethoxysilane in an amount by volume percent may be in the approximate range of 2%-6%. The surface modifier may form a monolayer of material on the surface of the substrate to protect the surface from being etched by the cleaning solution. For example, polymeric compounds having different polarities on opposite ends, such as a polyvinyl alcohol (PVA) compound, may be used to form the monolayer through self-assembly on the surface of the substrate 200. In an embodiment, the surface modifier may be included in the cleaning solution when it is formulated to be semi-aqueous because the surface modifier compounds tend to be polar compounds similar to water. The surface modifier can be selected to adhere to the entire surface of the substrate 200 or selectively to the substrate 200. The surface modifier would adhere to the surface of the substrate 200 through weak bonds that will easily break and wash away during a rinse after the application of the cleaning solution to the substrate 200. These types of compounds will "self-assemble" or form a thin passivating film on the surface of silicon containing materials such as silicon, silicon nitride, or silicon dioxide. The surface modifier may be added to either the acid based or the solvent based cleaning solution.

At block 105 of the flowchart of FIG. 1, the cleaning may be enhanced by agitating the cleaning solution. This may be accomplished by stirring, shaking, or by applying ultrasonic or megasonic energy to the cleaning solution. Agitating the cleaning solution or applying heat to the substrate 200 may increase the removal rate of the photoresist material 210 from the substrate 200.

At block 106 of FIG. 1, the substrate 200 may be rinsed to further remove the cleaning solution and any remaining photoresist material 210 residue. The rinsing may be done once or multiple times using an organic solvent that will prevent precipitation of dissolved reagents and photoresist material 210 from the solution and will also be water miscible, such as tetrahydrofuran (THF), isopropanol, or acetone.

A post-cleaning may also optionally applied to the substrate 200 at block 107. The post cleaning solution may be dHCl, dHF, or a mixture of ammonium hydroxide and hydrogen peroxide.

The process outlined in the flowchart of FIG. 1 may include any or all of the process steps to provide a wet only process for the removal of high dose implanted photoresist material 210 without damaging the underlying substrate 200. In some embodiments, the process may be performed without heating the substrate 200 or the cleaning solution to over 100° C.

Combinatorial Methodology

Figure 3:
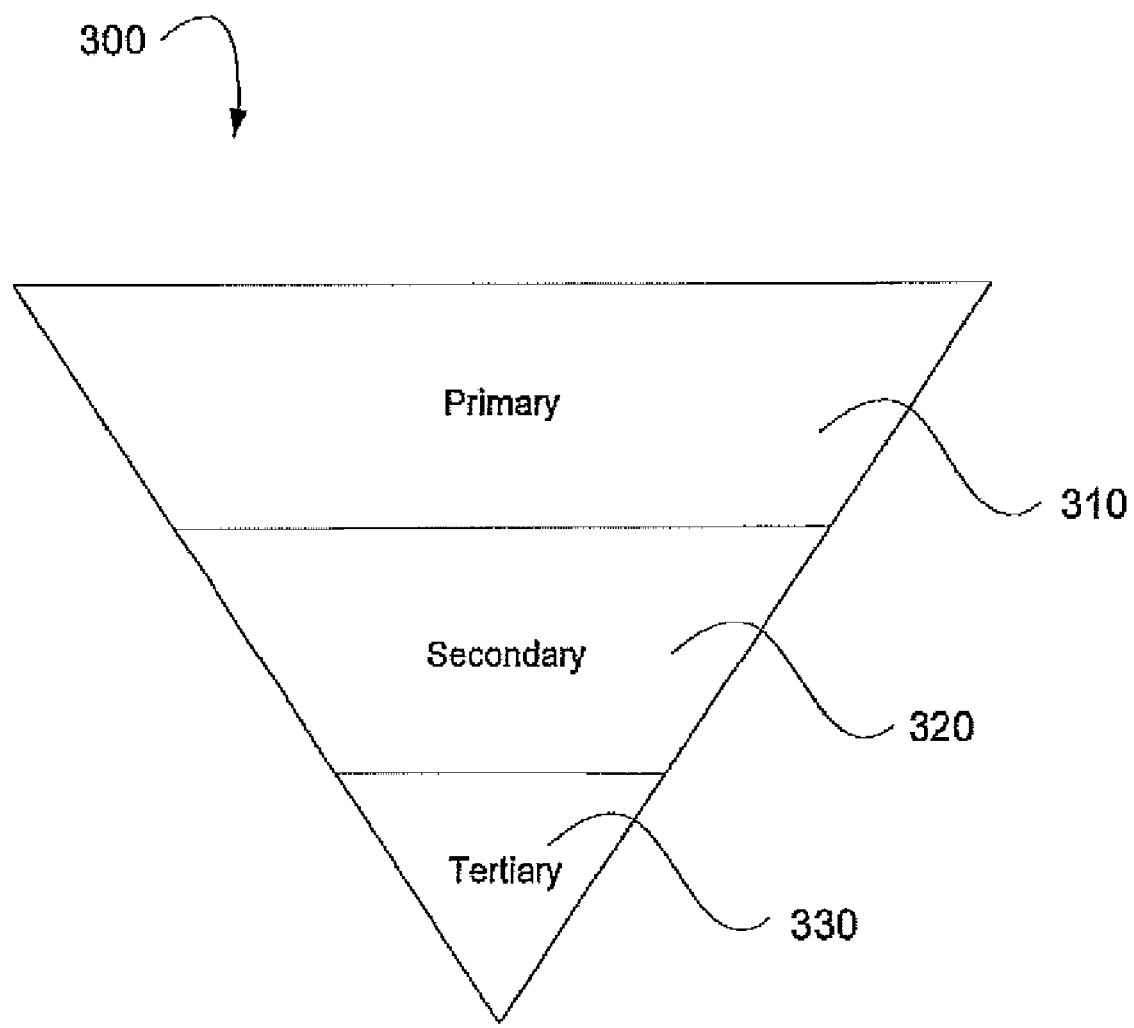
FIG. 3 is a diagram representing a funnel of different screening levels in combinatorial processing.

The cleaning solution may be developed using combinatorial methods of formulating the cleaning solution. Combinatorial processing may include any processing that varies the processing conditions in two or more regions of a substrate. The combinatorial methodology, in embodiments of the current invention, includes multiple levels of screening to select the cleaning solutions for further variation and optimization. In an embodiment, the cleaning solution is optimized to remove high dose implanted photoresist in an all-wet process without etching the underlying substrate by more than 1 angstrom in each cleaning process. FIG. 3 illustrates a diagram 300 showing three levels of screening for the development of the cleaning solution using combinatorial methodologies. The diagram 300 shows a funnel, where the primary screening 310 includes the largest number of samples of cleaning solutions funneling down to the secondary screening 320 and the tertiary screening 330 where the least number of samples of the cleaning solutions are tested. The number of samples used at any of the screening levels may be dependent on the substrate or tools used to process the samples.

In one particular embodiment of the current invention, the screening at the different levels of the funnel is designed to formulate a cleaning solution that is optimized to effectively remove a high dose implanted photoresist material from a substrate without significantly etching the substrate. At the primary screening level 310 of this embodiment, the cleaning solution is combinatorially screened in a high throughput manner to determine the ability of the cleaning solution to effectively remove a high dose implanted photoresist material from a semiconductor substrate. The combinatorial screening process used is as outlined in the flowchart illustrated in FIG. 4. The primary screening level 310, in one particular embodiment, tests for the removal of a high dose implanted photoresist material from a silicon substrate. In an embodiment of the primary screening process, the high dose implanted photoresist may be a blanket deposition of photoresist on a silicon substrate. The photoresist may be implanted with arsenic (As) or boron (B) ions at a dose of between $1-5\times10^{15}$ atoms/cm$^2$ implanted at an energy of between 1-5 KeV or $1-5\times10^{14}$ atoms/cm$^2$ implanted at an energy of between 1-5 KeV. The implantation process typically forms a hard carbonized crust layer of approximately 600 angstroms over approximately 3200 angstroms of photoresist. At block 401 of the flowchart of FIG. 4, the method begins by first defining multiple regions 510 of a substrate 500 as illustrated in FIG. 5. A region of a substrate may be any portion of the substrate that is somehow defined, for example by dividing the substrate into regions having predetermined dimensions or by using physical barriers, such as sleeves, over the substrate. The region may or may not be isolated from other regions. In the embodiment illustrated in FIG. 5, the regions 510 may be defined by multiple sleeves that are in contact with the surface of the substrate 500. The number of regions 510 defined by sleeves is only limited by the tools used for the combinatorial processing. As such, multiple experiments may be performed on the same substrate, and any number of regions may be defined. For example, five cleaning solutions may be tested using fifteen regions of a substrate, each cleaning solution being tested three times.

Figure 4:
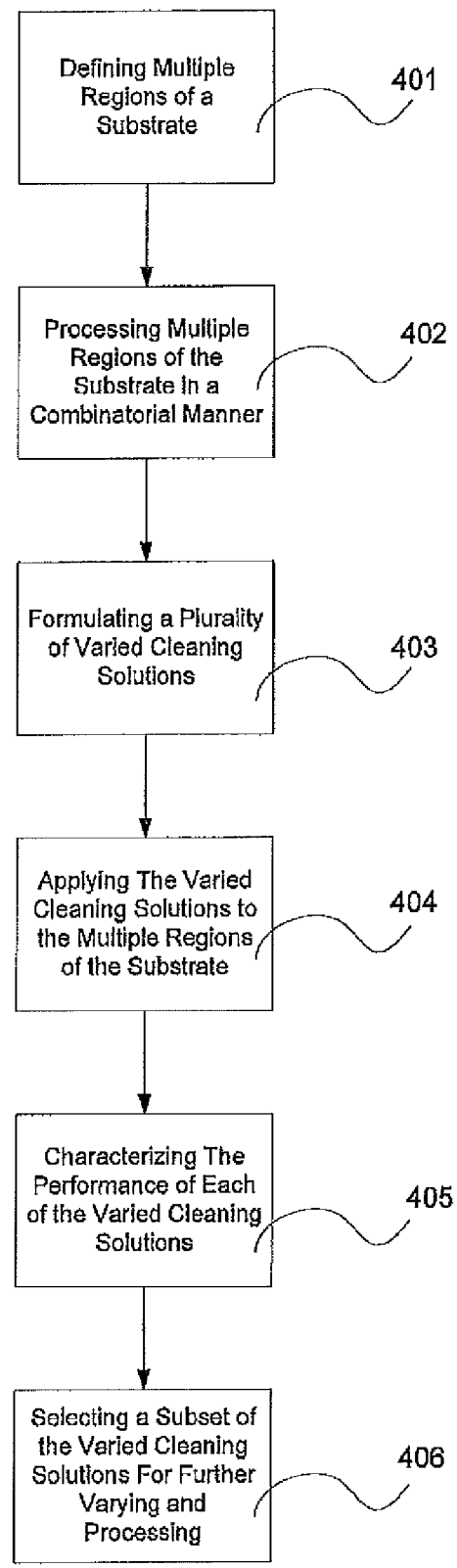
FIG. 4 is a flowchart describing a combinatorial processing method for photomask cleaning solutions.
Figure 5:
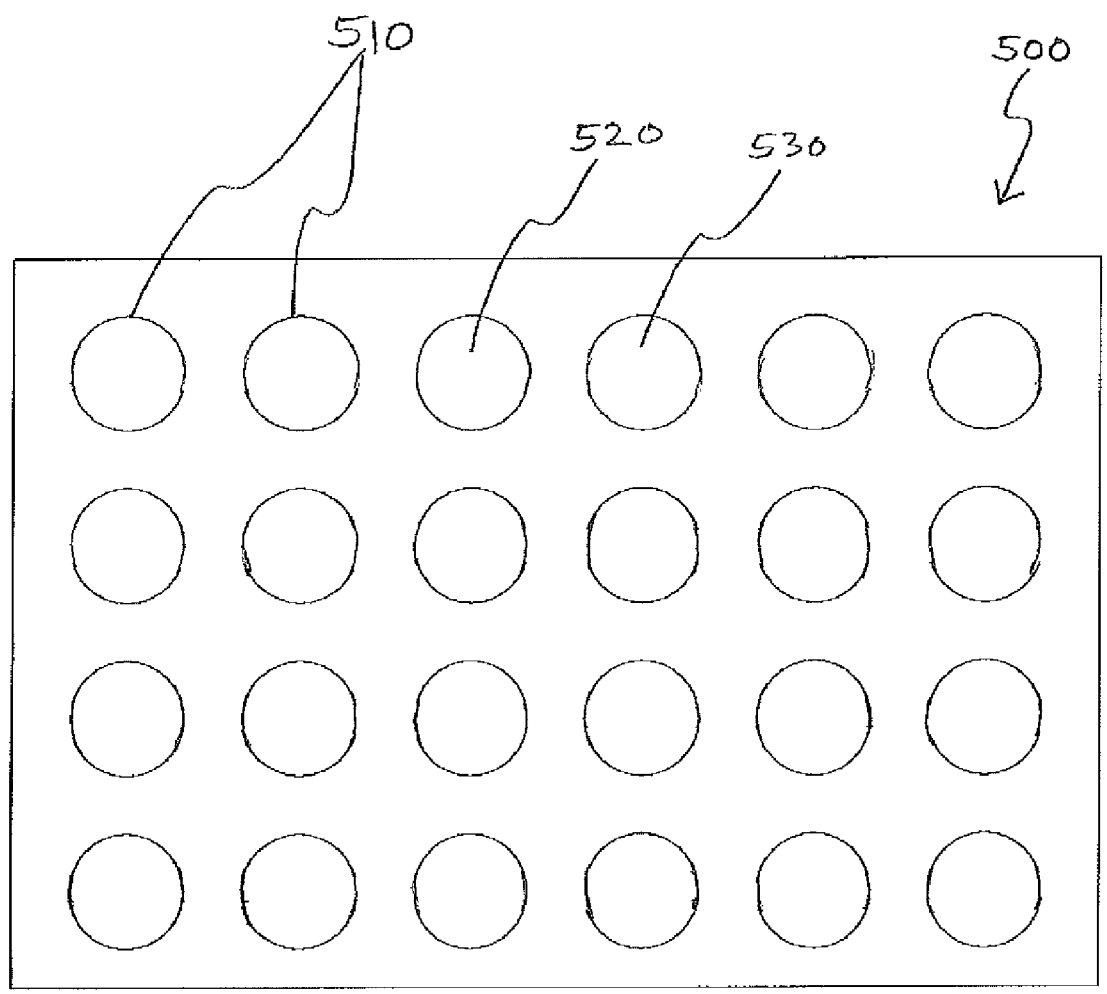
FIG. 5 illustrates a substrate for combinatorial processing according to an embodiment of the current invention.

At block 402 of the flowchart in FIG. 4, the multiple regions 510 of the substrate 500 are processed in a combinatorial manner. In an embodiment, this is done by formulating a plurality of varied cleaning solutions at block 403 of the flowchart in FIG. 4. In one embodiment, this involves formulating multiple cleaning solutions having methodically varied components by varying at least one of a chemical component within a cleaning solution formulated to remove high dose implanted photoresist. As described above, the cleaning solution may be acid based or solvent based. An example of varying the chemical components of a solvent based cleaning solution is varying the percent volume amounts of different organic solvents, such as DMSO and NMP. In one embodiment, the solvent based cleaning solution may be formed of a mixture of the two solvents DMSO (varied 0%-100% by volume of the solution) and NMP (varied 0%-100% by volume of the solution). In a particular embodiment, the cleaning solution may be varied by varying the percent volume of NMP within the approximate range of 90%-100%, where the embodiments of less than 100% NMP may also be varied to include water, TMAH and hexadecane. In another embodiment, the cleaning solution may be varied by varying the volume percent of DMSO in the approximate range of 90-100% by volume where the embodiments of less than 100% DMSO may also be varied to include water, TMAH, and hexadecane. In this embodiment, the solvent based cleaning solution was applied to each of the regions on the substrate at a temperature in the approximate range of 80° C. and 85° C. for a time of approximately 30 minutes while shaking the substrate to create agitation.

In another embodiment, the varied cleaning solution may be an acid based cleaning solution. In one embodiment the cleaning solution may be formed of a mixture of $H_2O_2$, $H_2SO_4$, and $HNO_3$ where the ratio of $H_2O_2$ to $H_2SO_4$ is varied between approximately 0.01-0.02 to 1, and the ratio of $HNO_3$ to $H_2SO_4$ may be varied between approximately 0.1-0.2 to 1. In one particular embodiment, the acid based cleaning solution may be applied to the regions of the substrate for a time in the approximate range of 5 minutes to 30 minutes while shaking the substrate to agitate the cleaning solution and the photoresist to improve removal of the photoresist. Additionally, the acid based cleaning solution may be heated within a range of 70° C. and 100° C. to applied to a heated substrate (also be heated to be within this temperature range.)

At block 404, the varied cleaning solutions are applied to the multiple regions 510 of the substrate 500. A single varied cleaning solution is applied to each of the multiple regions 510 for a predetermined amount of time. In one particular embodiment the cleaning solution is applied for up to 30 minutes to determine whether the cleaning solution can remove the photoresist within that amount of time.

At block 405, the performance of each of the varied cleaning solutions is characterized. The characterization is performed to determine how effectively each of the varied cleaning solutions removes the photoresist from each of the regions 510. The characterization is performed by first taking images of the substrate using optical microscopy. The initial optical microscopy images are taken at a scale of 5 mm×5 mm. The optical microscopy images will provide the information about whether the photoresist has been completely or mostly removed.

The screening then includes a second characterization of the regions 510 where the photoresist appeared to be completely removed based on the optical microscopy images. The regions 510 where the photoresist appeared to be completely removed are then characterized by AFM measurements to evaluate the roughness of the substrate and the removal of the photoresist on a finer scale. The AFM measurements have a resolution on the order of micrometers and may provide information on photoresist residue that remains on a finer scale. The AFM measurements provide the root means square (rms) average of the roughness of a region of the substrate to provide a measure of the roughness of the surface in nanometers. If the roughness measurement provided by AFM scans are within the standard deviation of the pre-scan of the substrate, then it is concluded that the cleaning solution can remove the high dose implanted photoresist material. Using this information, a subset of the varied cleaning solutions is then selected for further varying and processing at block 406 of the flowchart in FIG. 4.

The primary screening of the cleaning solution continues by applying the subset of cleaning solutions that are capable of removing the blanket photoresist from the silicon substrate. The next primary screening process determines whether the cleaning formulation etches the substrate. In particular, the substrate may be formed of a film of silicon nitride over silicon, a film of silicon dioxide over silicon, polysilicon, or amorphous silicon. The performance of each of the cleaning solutions applied to the multiple regions of the substrate is then characterized at block 405. The performance of the cleaning solution is characterized to determine whether the cleaning solution etches the substrate. The characterization is done by measuring not only the roughness (rms) of the substrate but also the height of the substrate using AFM measurements. The height of the substrate in each region is measured in a pre-scan along with the roughness of the substrate. The pre- and post-scans of the height determine whether the surface of the substrate has been eroded or etched. If there is no statistically significant difference between the pre- and post-scans, meaning that the post-scan measurements are within the standard deviation of the pre-scan, then it is concluded that the cleaning solution has not etched the substrate and has no significant impact on the substrate. No significant impact on the substrate means that less than 1 angstrom of the substrate has been etched. At block 406 a subset of the varied cleaning solutions is selected for further varying and processing based on the characterization data. The cleaning solutions selected for processing in the secondary screening level 320 are those for which it was concluded that the cleaning solution removes the photoresist and does not significantly etch the substrate.

The combinatorial methodology then funnels down to the secondary screening 320 of FIG. 3. The subset of selected cleaning solutions from the primary screening 310 is then tested on a substrate having a patterned high dose implant photoresist to determine whether the cleaning solution can effectively remove a patterned photoresist. The secondary screening uses the same methodology as the primary screening, as outlined in the flowchart of FIG. 4. After defining the multiple regions on the substrate at block 401, using similar methods as described above, the multiple regions of the substrate are processed in a combinatorial manner at block 402. The processing in a combinatorial manner is performed by formulating a plurality of varied cleaning solutions at block 403 based on the subset of cleaning solutions selected at the end of the primary screening process. At block 404 these selected cleaning solutions are applied to the multiple regions of the substrate to determine the ability of the cleaning solution to remove the patterned photoresist.

The tertiary screening level 330 of the combinatorial funnel will perform the final screening of the cleaning solutions. In an embodiment, the number of cleaning solutions at this screening level may be less than ten, in one particular embodiment the number of cleaning solutions may be one or two, but could be any number. The final screening will optimize the cleaning solution on an actual substrate that has been processed in the front end of the line (FEOL), including a high dose implant using a photoresist material as a mask. The cleaning solution is used to clean the high dose implanted photoresist off of the substrate and the substrate is then tested to screen the final batch of cleaning solutions. The characterization of the cleaning solution at the tertiary screening level 303 will, similar to the characterization in the primary screening level, determine how effectively each of the varied cleaning solutions removes the patterned photoresist from each of the regions 510. The characterization is performed by first taking images of the substrate using optical microscopy. The optical microscopy images will provide the information about whether the photoresist has been completely or mostly removed. The screening then includes a second characterization of the regions 510 where the photoresist appeared to be completely removed based on the optical microscopy images. The regions 510 where the photoresist appeared to be completely removed are then characterized by AFM measurements to evaluate the roughness of the substrate and the removal of the photoresist on a finer scale. The AFM measurements have a resolution on the order of micrometers and may provide information on photoresist residue that remains on a finer scale. The AFM measurements provide the root means square (rms) average of the roughness of a region of the substrate to provide a measure of the roughness of the surface in nanometers. SEM images may also be taken of the regions to gain greater insight. The characterization will indicate which of the cleaning solutions can be used to clean high dose implanted photoresist from substrates in production.

Although the foregoing examples have been described in some detail for purposes of clarity of understanding, the invention is not limited to the details provided. There are many alternative ways of implementing the invention. For example, the phrases primary, secondary and tertiary screening are arbitrary and can be intermixed or modified as necessary: different substrates can be used for different levels, information from the secondary screening can be fed back into the primary screening to change the initial screening, or to provide additional variable for that screening, the various screening levels can be run partially in parallel to enable feeding back information, or other modifications to the screening funnel can be made by those of skill in the art. The disclosed examples are illustrative and not restrictive.

What is claimed:

1. A method, comprising:
   obtaining a substrate comprising silicon and having a developed implanted photoresist layer with an ion concentration greater than $1\times10^{15}$ atoms per $cm^2$;
   baking the substrate and the developed implanted photoresist layer at a temperature that avoids cracking of the photoresist layer; and
   applying a cleaning solution after the baking, the cleaning solution comprising $H_2O_2$, $H_2SO_4$ and $HNO_3$ to the substrate to remove the implanted photoresist layer, wherein the ratio of $H_2O_2$ to $H_2SO_4$ is approximately between 0.01 to 1, and wherein the ratio of $HNO_3$ to $H_2SO_4$ is approximately between 0.1 to 1.

2. The method of claim 1, wherein the substrate further comprises silicon nitride and the cleaning solution etches less than 1 angstrom of the silicon or the silicon nitride.

3. The method of claim 1, wherein the substrate further comprises silicon dioxide and the cleaning solution etches less than 1 angstrom of the silicon or the silicon dioxide.

4. The method of claim 1, further comprising heating the cleaning solution to a temperature in the approximate range of 80° C. and 120° C.

5. The method of claim 1, wherein the baking occurs for approximately 20 minutes at a temperature of approximately 190° C.

6. The method of claim 1, further comprising prior to applying the cleaning solution, pre-rinsing the substrate with water.

7. The method of claim 1, further comprising after applying the cleaning solution, post-rinsing the substrate with deionized water.

8. The method of claim 1, further comprising applying physical agitation to the substrate while applying the cleaning solution.

9. The method of claim 1, wherein the cleaning solution is applied to the substrate for a time between about 30 minutes to 1 hour.

* * * * *